(12) United States Patent
Yamazaki et al.

(10) Patent No.: US 8,647,463 B2
(45) Date of Patent: Feb. 11, 2014

(54) METHOD FOR FORMING TRANSPARENT CONDUCTIVE LAYER PATTERN

(75) Inventors: Yoshikazu Yamazaki, Konosu (JP); Satoshi Hayakawa, Saitama (JP); Masashi Miyamoto, Saitama (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/379,815

(22) PCT Filed: Jun. 29, 2010

(86) PCT No.: PCT/JP2010/061026
§ 371 (c)(1),
(2), (4) Date: Dec. 21, 2011

(87) PCT Pub. No.: WO2011/001961
PCT Pub. Date: Jan. 6, 2011

(65) Prior Publication Data
US 2012/0094090 A1   Apr. 19, 2012

(30) Foreign Application Priority Data

Jun. 30, 2009   (JP) ................................. 2009-155181

(51) Int. Cl.
*B32B 3/00*   (2006.01)

(52) U.S. Cl.
USPC ............................................ 156/249; 427/58

(58) Field of Classification Search
USPC ........................................ 428/195.1; 156/249
See application file for complete search history.

(56) References Cited

U.S. PATENT DOCUMENTS

| 2005/0153107 A1* | 7/2005 | Iijima ........................ 428/195.1 |
| 2008/0283799 A1* | 11/2008 | Alden et al. ................... 252/500 |
| 2009/0160817 A1* | 6/2009 | Wu et al. ....................... 345/173 |

FOREIGN PATENT DOCUMENTS

| JP | 61-077279 A | 4/1986 |
| JP | 8-152513 A | 6/1996 |
| JP | 9-161582 A | 6/1997 |
| JP | 2003-015286 A | 1/2003 |
| JP | 2006-140264 A | 6/2006 |
| JP | 2006-156305 A | 6/2006 |
| JP | 2009-505358 A | 2/2009 |

OTHER PUBLICATIONS

International Search Report of PCT/JP2010/061026, mailing date Oct. 19, 2010.

* cited by examiner

*Primary Examiner* — Mark Ruthkosky
*Assistant Examiner* — Ian Rummel
(74) *Attorney, Agent, or Firm* — Westerman, Hattori, Daniels & Adrian, LLP

(57) ABSTRACT

Provided is a low-cost method for easily forming a transparent conductive pattern that has a low electrical resistance and high transparency, and that is highly invisible to the eye. The method for forming a transparent conductive layer pattern includes the steps of (1) detachably forming a transparent conductive layer on a substrate; (2) then forming, on a support, a negative-patterned heat-sensitive adhesive image; (3) bonding the substrate to the support so that the transparent conductive layer and the heat-sensitive adhesive layer are in close contact with each other; (4) forming a pattern of the transparent conductive layer on the substrate by detaching the support from the substrate to transfer a portion of the transparent conductive layer, the portion being in close contact with the heat-sensitive adhesive layer, to the heat-sensitive adhesive layer; and (5) fixing the transparent conductive layer on the substrate by applying a coating material for a protective layer onto a front surface of the substrate on which the pattern of the transparent conductive layer is formed and impregnating the transparent conductive layer with the coating material.

7 Claims, 3 Drawing Sheets

METHOD FOR FORMING TRANSPARENT CONDUCTIVE LAYER PATTERN

TECHNICAL FIELD

The present invention relates to a method for forming a transparent conductive layer pattern on a substrate.

More specifically, the present invention relates to a method for forming a transparent conductive layer pattern on a substrate, the method including partially detaching a transparent conductive layer using a substrate having the detachable transparent conductive layer composed of a fine conductive substance thereon and a support having a layer having a negative-patterned adhesive area thereon, more preferably, a support having a heat-sensitive adhesive layer thereon.

BACKGROUND ART

Various materials for forming a transparent conductive layer and various transparent conductive layer films obtained by forming a transparent conductive layer on a transparent substrate are used as important functional components in, for example, electronic devices that utilize a light emitting/receiving function. In particular, components to which a function of an electrode, a switch, or the like is provided by arranging a large number of conductive areas on a transparent substrate by patterning a transparent conductive layer are essential components for realizing reduction in the thickness and size of such electronic devices, and for realizing high performance of such electronic devices.

Hitherto, an ITO film, which is composed of an indium-based oxide, has been mainly used as a transparent conductive layer because of its high transmittance of visible light, low surface electrical resistance, and excellent environmental characteristics. There are various methods for producing an ITO film functioning as a transparent conductive layer. Among these methods, a main method is a sputtering method, in which a dilute inert gas is introduced in a vacuum, and inert gas ions generated by DC or RF discharge are accelerated and made to collide on a surface of an ITO target material so as to sputter atoms and molecules constituting the target from the surface, thus forming an ITO film on a surface by deposition. The sputtering method is advantageous in that a conductive layer having a low surface electrical resistance can be formed even on a somewhat large area. However, the deposition rate in the sputtering method is low, and in order to deposit a conductive film having a homogeneous quality, it is necessary to increase the accuracy of the control of an apparatus, for example, the gas concentration and the temperature inside the apparatus. For these reasons, it is difficult to increase the size of the apparatus.

For a transparent conductive layer formed of an ITO film or the like obtained by the sputtering method, a transparent conductive layer pattern is formed by an etching method. The etching method is performed by utilizing photolithography including steps such as application of a resist film, exposure, development, chemical etching, and removal of the resist film in a solution, the steps being sequentially performed on the transparent conductive layer. Thus, this process speed of the etching method is low, and the etching method has a problem in terms of a high production cost including the cost of disposal of liquid waste generated in the steps of development, chemical etching, and removal of the resist film by a wet process.

Furthermore, in order to obtain a dense, low-resistance, and transparent coating film using an ITO film formed by the sputtering method, the film must be baked at about 300° C., and thus it is impossible to form such a coating film on a plastic film.

As described above, the production of a transparent conductive layer requires a plurality of complicated steps in the film-forming process or the patterning process. Accordingly, it is difficult to significantly improve the production efficiency, and the suppression and reduction in the production cost are also limited. Furthermore, the type of substrate that can be used is also significantly limited because of the necessity of the baking.

A relatively low-cost method for obtaining a transparent conductive layer pattern using a printing method, the method having been hitherto employed, is a method for forming a transparent conductive layer pattern on a substrate using a conductive layer coating material prepared by dispersing conductive fine particles such as ITO particles in a binder solution and using a patterning method that utilizes a printing technology such as a screen printing method. This method is advantageous in that the apparatus is simple and productivity is high, and that a transparent conductive layer pattern having a large area can be produced at a low cost by only a coating step, as compared with the method in which a conductive film is formed by sputtering and is then patterned by etching. However, a conductive layer obtained by this method has a drawback of high electrical resistance because, in this method, a conductive coating film is formed using a binder resin and thus the contact between conductive fine particles becomes insufficient.

In another known method, a transparent conductive layer pattern is formed by preparing a binder-resin-free conductive coating material containing conductive fine particles such as ITO fine particles, a solvent, a coupling agent, and an organic acid salt or inorganic acid salt of a metal, applying the conductive coating material onto a substrate so as to form a pattern by a printing method such as a screen printing method, and conducting baking at a temperature of 300° C. or higher. In this method, since no binder is contained, the electrical resistance of the conductive layer decreases. However, since a high-temperature baking at 300° C. or higher is necessary for the film formation, it is difficult to form a conductive layer pattern on a flexible substrate such as a resin film.

Furthermore, as a method for forming a transparent conductive layer pattern having a low electrical resistance on a substrate having poor heat resistance using a simple, low-cost method for forming a transparent conductive layer without using a sputtering method, a method has been proposed in which a conductive layer pattern can be formed by using a conductive film for transfer, the conductive film including a support and a conductive layer provided on and detachable from the support, without conducting firing or baking at a high temperature.

For example, the following method for forming a conductive layer pattern has been proposed. The method includes preparing a conductive film for transfer, the conductive film including a support and a transparent conductive layer that is provided on and detachable from the support and that is formed of a compressed layer of conductive fine particles; bonding the transparent conductive layer to a surface of a substrate from the conductive film for transfer with an adhesive layer therebetween, the adhesive layer having an adhesive area patterned by exposure or the like; and detaching the support from the substrate so that only a portion of the conductive layer, the portion being in close contact with the adhesive layer in the adhesive area, is left on the substrate (refer to Patent Literature 1). It is described that the adhesive layer that bonds the transparent conductive layer to the substrate may be formed on the transparent conductive layer or may be formed on the substrate in advance. In the above method, the conductive layer is formed and fixed without performing a vacuum process for film formation, and firing or baking at a high temperature, and a pattern is formed without performing a wet process such as etching. However, in order to fix the transparent conductive layer, which is originally formed so as to be detached and which has a weak adhesive strength to the support and the substrate, the transparent conductive layer pattern is fixed on the substrate with the adhesive layer having a relatively large thickness therebetween. Consequently, the transparent conductive pattern including the adhesive layer is formed as a projecting layer having a large thickness. As a result, the conductive pattern, which should be transparent, easily visually recognized. When such a conductive pattern is used as a transparent conductive electrode for a touch panel or electronic paper, the transparent conductive electrode being used by bonding on a liquid crystal display panel, the visible electrode pattern adversely affects the quality of a display image.

A method for forming a patterned conductive layer on a substrate without interposing an adhesive layer has been proposed (refer to Patent Literature 2). Specifically, in this disclosed method, a desired pattern is formed by forming a photosensitive resin layer on a surface of a metal layer provided on a transparent substrate, partially forming an area having a strong adhesive strength on the photosensitive resin layer by light irradiation, and detaching, from the transparent substrate, a portion of the metal layer located at a position corresponding to the above area so as to left a necessary conductive layer pattern on the substrate.

However, in the above method, after the formation of the conductive pattern, the conductive layer is still in a state of being detachable from the substrate, and thus weak adhesiveness remains. Therefore, this method is not preferable from the standpoint of processing and practical use. Furthermore, in the previous step, the photosensitive resin layer is uniformly formed on the surface of the conductive layer, and the whole conductive layer contacts the photosensitive resin. Accordingly, a non-irradiated portion may remain on the conductive layer, or a desired necessary portion of the conductive layer may be detached from the substrate. If the conductive layer is a transparent conductive layer, such a remaining non-irradiated photosensitive resin may decrease the light transmittance of the transparent conductive layer. In addition, in the case where the adhesive strength of the conductive layer before detachment, the conductive layer being formed on the substrate, is weak, a conductive layer portion that should not be detached may also be detached from the substrate by the non-irradiated photosensitive resin. Accordingly, it is believed that the above method can be suitably used only when the detachable conductive layer formed on the substrate has an appropriate adhesive strength, the conductive layer and the substrate are not transparent, and the photosensitive resin remaining on the substrate is not visible either directly or through the substrate and the transparent conductive layer.

Meanwhile, a transparent conductive coating material capable of providing, as a novel transparent conductive layer, a coating film having high transparency and an electrical resistance that is as low as that of an existing ITO film, and a method for forming a transparent conductive layer pattern using the transparent conductive coating material have been proposed (refer to Patent Literature 3). This literature describes that, by using conductive nanowires each having a high aspect ratio of more than 10 and a cross-sectional dimension of less than 100 nm, a substantially transparent conductive wire network can be formed to form a transparent conductive layer. Furthermore, a method for forming a transparent conductive layer has been proposed in which a transparent conductive coating material prepared by dispersing, as such conductive nanowires, for example, silver nanowires produced by a specific method in a solvent is applied onto a substrate and dried, thereby arranging the silver nanowires so as to have a network shape and obtaining a transparent conductive layer having good transparency and conductivity.

Furthermore, as a method for forming a transparent conductive layer pattern using the above silver nanowires, described is a method for forming a transparent conductive pattern, the method including forming a conductive layer containing silver nanowires on a substrate, then fixing the silver nanowires so as to have a pattern using a binder resin or the like, and then washing or brushing a non-fixed area with an appropriate solvent or removing the area with an adhesive roller.

Also described is a method for forming a transparent conductive pattern, the method including forming a transparent conductive layer of silver nanowires on a substrate, then applying a coating material for fixing, the coating material being curable by light or heat, over the entire surface of the conductive layer, curing the coating material by applying light or heat only to a portion to be left as a pattern, and then removing an unnecessary portion by the same method as the method described above.

In the above methods, it is possible to form a transparent conductive pattern that has conductivity and high transparency and that is not easily visible. However, the conductive layer composed of the silver nanowires before fixing has a weak adhesive strength to the substrate and is porous. Accordingly, it is very difficult to fix the nanowires by providing a patterned binder resin thereon or to form a fixing pattern by irradiating a uniformly applied binder resin with light without impairing the adhesion to the substrate and without damaging the network of the silver nanowires in the conductive layer. Specifically, there is a limitation in accurately providing the patterned binder resin on the conductive layer, and it is also difficult to accurately remove only a non-fixed portion by washing or using an adhesive roller. Also, even in the case where a binder resin is uniformly provided on the conductive layer and a fixing pattern is formed by light irradiation, adhesiveness remains in a portion to which light is not applied, and thus it is difficult to form a precise pattern by accurately and completely removing the non-irradiated portion. In removing the non-fixed portion or the uncured area of the transparent conductive layer thus prepared, in particular, when these patterns are precise and the line width and the distance between adjacent lines are narrow, it is difficult to remove a narrow-space portion and to left a thin-line portion. Consequently, there may be a problem that pattern short-circuit due to incomplete removal of the conductive layer and disconnection due to excessive removal of the conductive layer easily occur in the resulting conductive layer pattern.

CITATION LIST

Patent Literature

PTL 1: Japanese Unexamined Patent Application Publication No. 2003-015286
PTL 2: Japanese Unexamined Patent Application Publication No. 2006-140264

PTL 3: Japanese Unexamined Patent Application Publication (Translation of PCT Application) No. 2009-505358

SUMMARY OF INVENTION

Technical Problem

An object of the present invention is to provide a method for forming a patterned transparent conductive layer, the method being simple and having excellent production efficiency, in which, in forming a patterned transparent conductive layer on a substrate, a transparent conductive layer having a good light transmittance, a low haze value, and excellent conductive performance can be formed by a common coating step without using vapor deposition, sputtering, or the like, the transparent conductive layer can be patterned without performing a wet process such as etching, and furthermore, the transparent conductive layer thus formed can be satisfactorily fixed without performing a firing or baking treatment.

Solution to Problem

As a result of intensive studies conducted in order to achieve the above object, the inventors of the present invention found the following: A transparent conductive layer is detachably formed on a substrate by coating, and a portion of the transparent conductive layer is then detached using a detachment base having a patterned adhesive layer, whereby the transparent conductive layer can be satisfactorily patterned. Furthermore, the patterned transparent conductive layer can be fixed by an applying a resin solution. This finding led to the realization of the present invention. Specifically, the present invention provides a method for forming a patterned transparent conductive layer, the method including the steps of (1) forming a detachable transparent conductive layer on a substrate by coating, (2) forming, on a support, a layer having a negative-patterned adhesive area, (3) bonding the substrate to the support so that the transparent conductive layer, the adhesive area of the layer having the adhesive area, and an heat-sensitive adhesive layer are in close contact with each other, (4) forming a pattern of the transparent conductive layer on the substrate by detaching the support from the substrate to transfer a portion of the transparent conductive layer, the portion being in close contact with the adhesive area layer of the layer having the adhesive area, to the adhesive area of the layer having the adhesive area, and (5) fixing the transparent conductive layer on the substrate by applying a coating material for a protective layer over the entire surface of the substrate on which the pattern of the transparent conductive layer is formed.

The transparent conductive layer of the present invention is formed by coating without using sputtering, which is an existing vacuum process. Therefore, a special, dedicated vacuum apparatus need not be prepared and the production can be continuously performed using a common coater, and thus high production efficiency can be realized. Furthermore, in the production method of the present invention, a patterned transparent conductive layer is formed on a substrate by a method in which a portion of the transparent conductive layer is detached from the substrate using a patterned adhesive layer without using a wet process such as etching. Thus, disposal of waste liquid used in etching is not necessary. The patterning of the transparent conductive layer can be performed by bonding the substrate having the transparent conductive layer thereon to a support having the patterned adhesive layer thereon, and then detaching the support. Accordingly, the bonding and the detachment of on the transparent conductive layer can be performed by continuously applying, to the substrate having the transparent conductive layer thereon, a roll-shaped support on which, for example, a layer having a negative-patterned adhesion area, more preferably, a negative-patterned heat-sensitive adhesive layer is continuously formed. Thus, the patterning can be efficiently performed. Furthermore, in the present invention, the conductive layer after patterning is fixed with a resin without firing or baking the conductive layer. Accordingly, the conductive layer can be continuously fixed by, for example, applying a coating material for a protective layer, from above the patterned transparent conductive layer, over the entire surface of the substrate, the surface of which is partially covered with the transparent conductive layer. Thus, the patterned transparent conductive layer can be formed with very high production efficiency.

The present invention also provides a method for producing a substrate having a transparent conductive layer, the method including forming a pattern of a transparent conductive layer on a substrate by the above-described method for forming a patterned transparent conductive layer. According to the method for producing a substrate having a transparent conductive layer, in which the above method for forming a transparent conductive layer is employed, a substrate having a transparent conductive layer having good optical properties and an excellent electrical conduction property can be produced at a low cost by a simple method that mainly includes a coating step. In addition, since the substrate having the transparent conductive layer can be produced without performing a baking step, a plastic film can be used as the substrate.

Specifically, the present invention also provides a method for producing a transparent conductive film for a touch panel, the method including forming a pattern of a transparent conductive layer for a touch panel on a film-like substrate by the above-described method for forming a patterned transparent conductive layer. According to the method for producing a transparent conductive film for a touch panel of the present invention, a conductive film for a touch panel, the conductive film having excellent optical properties and an excellent electrical conduction property, can be produced at a low cost by a simple method that may includes a coating step without performing a baking step, a light irradiation step, an etching step, and the like.

Advantageous Effects of Invention

By employing the method for producing a patterned transparent conductive layer of the present invention, it is possible to easily form, at a low cost, a transparent conductive layer pattern that has high transparency and high invisibility, that has a low electrical resistance which is low enough to allow it to be used as a transparent electrode, and that is patterned with high accuracy without disconnection and short-circuit.

DESCRIPTION OF EMBODIMENTS

Figure 1:
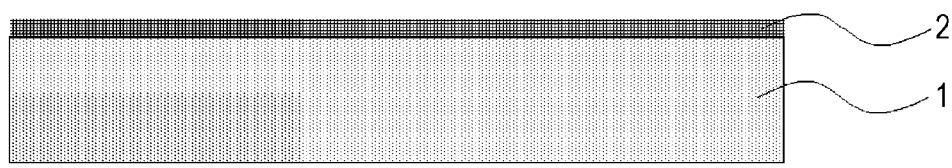
FIG. 1 is a cross-sectional view of a substrate having a transparent conductive layer in the present invention.

A method for forming a patterned transparent conductive layer of the present invention is a method for forming a patterned transparent conductive layer on a substrate, the method including the steps of:
(1) forming a detachable transparent conductive layer on a substrate by coating;
(2) forming, on a support, a layer having a negative-patterned adhesive area;
(3) bonding the substrate to the support so that the transparent conductive layer and the adhesive area of the layer having the adhesive area are in close contact with each other;
(4) forming a pattern of the transparent conductive layer on the substrate by detaching the support from the substrate to transfer a portion of the transparent conductive layer, the portion being in close contact with the adhesive area of the layer having the adhesive area, to the adhesive area of the layer having the adhesive area; and
(5) fixing the transparent conductive layer on the substrate by applying a coating material for a protective layer over the entire surface of the substrate on which the pattern of the transparent conductive layer is formed.

More preferably, the method includes the steps of (1) forming a detachable transparent conductive layer on a substrate by coating; (2) forming, on a support, a negative-patterned heat-sensitive adhesive layer; (3) bonding the substrate to the support so that the transparent conductive layer and the heat-sensitive adhesive layer are in close contact with each other; (4) forming a pattern of the transparent conductive layer on the substrate by detaching the support from the substrate to transfer a portion of the transparent conductive layer, the portion being in close contact with the heat-sensitive adhesive layer, to the heat-sensitive adhesive layer; and (5) fixing the transparent conductive layer on the substrate by applying a coating material for a protective layer over the entire surface of the substrate on which the pattern of the transparent conductive layer is formed.

Note that, in the present invention, the term "negative pattern" refers to a pattern that has the same scale and that is the inverse, in terms of negative and positive portions, of a pattern (positive pattern) of a transparent conductive layer to be formed on a substrate.

A detailed description will now be made of various materials used in steps of a method for forming a patterned transparent conductive layer of the present invention. Subsequently, the formation of the patterned transparent conductive layer of the present invention using the materials will be described in detail for each of the steps.

(A) [Formation of Detachable Transparent Conductive Layer]

A detachable transparent conductive coating film of the present invention is formed by applying, onto a substrate, a transparent conductive coating material in which a fine transparent conductive substance is dispersed in a liquid medium (dispersion medium). Herein, the term "transparent conductive substance" also refers to a substance that can function as a conductive material forming a transparent conductive layer by controlling the shape or the content thereof, even if the substance itself is not transparent. The transparent conductive layer of the present invention preferably has a surface resistivity of 0.01 $\Omega$/square to 1,000 $\Omega$/square, has high transparency in the visible light range, preferably has a total light transmittance of 80% or more, and is detachable from a substrate. Herein, the term "detachable" means that when a detachment base having at least an adhesive layer on a surface thereof is prepared, the adhesive layer of the detachment base and a transparent conductive layer are overlapped and bonded to each other, and the detachment base is then detached, the transparent conductive layer on a substrate can be detached without causing internal fracture and without damaging the substrate and an interface between the substrate and the transparent conductive layer.

Fine transparent conductive substances having various shapes such as a particle shape, a fiber shape, or a thin-film shape can be used as the fine transparent conductive substance.

Examples of the particle-shaped transparent conductive substance include conductive inorganic fine particles of tin oxide, cadmium oxide, antimony-doped tin oxide (ATO), fluorine-doped tin oxide (FTO), tin-doped indium oxide (ITO), aluminum-doped zinc oxide (AZO), and the like, all of which are formed by a known method. Among these, ITO is preferable from the standpoint of obtaining excellent conductivity. Alternatively, it is also possible to use a fine substance which functions as a core material, and the surface of which is coated with a transparent conductive substance. For example, it is possible to use transparent fine particles which are composed of barium sulfate or the like, and the surfaces of which are coated with an inorganic material such as ATO or ITO. Alternatively, organic conductive fine particles may be used as the core material. An example of this case is resin fine particles, the surfaces of which are coated with a metallic material. In general, the particle diameter of these fine particles is preferably 10 μm or less, more preferably 1.0 μm or less, and still more preferably 50 nm to 150 nm.

The fine conductive substance used in the present invention is preferably a fibrous conductive substance. Among fibrous conductive substances, it is preferable to use wire-shaped substances which do not branch, which are easily loosened, and with which a uniform distribution density of the fibrous substance can be easily achieved, and as a result, large openings are formed between entanglements of fibers to realize a satisfactory light transmittance. Examples of the conductive substance having such a shape include carbon nanotubes and metal nanowires which are wire-shaped conductive metals. In the present invention, the term "metal nanowire" refers to a nanometer-sized fine conductive substance having a linear or curved thin bar shape and composed of a metal. Fine conductive substances having a fiber shape, preferably, a wire shape are preferable because the substances are entangled with each other to form a network shape, and thus a satisfactory electrical conduction route can be formed even in a small amount of conductive substance, and the resistance of the resulting conductive layer can be further decreased. Furthermore, in the case where such a network is formed, the size of openings formed in gap portions of the network is large. Therefore, even when the fibrous conductive substance itself is not transparent, satisfactory transparency can be achieved as a coating film.

Specific examples of the metal of the metal nanowire include iron, cobalt, nickel, copper, zinc, ruthenium, rhodium, palladium, silver, cadmium, osmium, iridium, platinum, and gold. From the standpoint of conductivity, copper, silver, platinum, and gold are preferable. At least one cross-sectional dimension of the metal nanowire is preferably less than 500 nm, more preferably less than 200 nm, and still more preferably less than 100 nm. The aspect ratio of the metal nanowire preferably exceeds 10. The aspect ratio more preferably exceeds 50, and still more preferably exceeds 100. The shape and the size of the metal nanowire can be examined by a scanning electron microscope or a transmission electron microscope.

The metal nanowire can be produced and prepare by a method known in this technical field. Examples of the method include a method in which silver nitrate is reduced in a solution and a method including applying a voltage or a current from a leading end of a probe to a surface of a precursor, and drawing a metal nanowire with the leading end of the probe to continuously form the metal nanowire (Japanese Unexamined Patent Application Publication No. 2004-223693). Regarding the method in which silver nitrate is reduced in a solution, more specifically, a silver nanowire can be synthesized by conducting liquid-phase reduction of a silver salt such as silver nitrate in the presence of a polyol such as ethylene glycol and polyvinylpyrrolidone. A mass production of silver nanowires having a uniform size can be conducted in accordance with the methods described in Xia, Y. et al., Chem. Mater. (2002), 14, 4736-4745 and Xia, Y. et al., Nano Letters (2003) 3(7), 955-960, but the method is not particularly limited thereto.

A substantially transparent conductive network can be obtained by arranging such metal nanowires having conductivity on a transparent substrate in an entangled state at appropriate intervals to form a conductive network. The specific type of metal, the length of an axis, the aspect ratio, and the like are appropriately determined in accordance with the intended use, etc.

A liquid serving as a dispersion medium in which the fine conductive substance is dispersed to form a transparent conductive coating material is not particularly limited, and various known dispersion media can be used. Examples thereof include saturated hydrocarbons such as hexane; aromatic hydrocarbons such as toluene and xylene; alcohols such as methanol, ethanol, propanol, and butanol; ketones such as acetone, methyl ethyl ketone (MEK), methyl isobutyl ketone, and diisobutyl ketone; esters such as ethyl acetate and butyl acetate; ethers such as tetrahydrofuran, dioxane, and diethyl ether; amides such as N,N-dimethylformamide, N-methylpyrrolidone (NMP), and N,N-dimethylacetamide; and halogenated hydrocarbons such as ethylene chloride, and chlorobenzene. A dispersant may also be used depending on the type of dispersion medium. Among these dispersion media, dispersion media having polarity are preferable. In particular, dispersion media having affinity with water, such as alcohols, e.g., methanol and ethanol, and amides, e.g., NMP are preferable because the dispersibility is good even when no dispersant is used. These liquids may be used alone or as a mixture of two or more liquids.

Water can also be used as the dispersion medium. In the case where water is used, when a surface of a transparent substrate is hydrophobic, the surface tends to repel water and a uniform film is not easily obtained in coating the resulting transparent conductive coating material. In such a case, an alcohol is mixed with water or a surfactant that improves wettability to the hydrophobic transparent substrate is selected and added to water so as to obtain a uniform film.

The amount of liquid used as the dispersion medium is not particularly limited as long as a dispersion liquid of the above-described fine conductive substance has a viscosity suitable for coating. For example, the amount of liquid can be set to a wide range of about 100 to 100,000 parts by weight relative to 100 parts by weight of the transparent conductive substance. The amount of liquid can be appropriately selected in accordance with the types of transparent conductive substance and dispersion medium, and a stirring and dispersion device used.

The dispersion of the transparent conductive substance in the dispersion medium can be conducted by applying a known dispersion method, as required, to a mixture of the transparent conductive substance and a liquid serving as the dispersion medium. However, in order to form a transparent conductive layer having good transparency and conductivity, it is important that characteristics of the fine conductive substance do not significantly change before and after the dispersion treatment, and that transparency of the mixture be not lost. In particular, in the case where the conductive substance is metal nanowires, breaking of the metal nanowires causes a decrease in the conductivity and a decrease in the transparency, and thus it is important to select a dispersion method in which the shape of the metal nanowires is not broken.

Preferably, the dispersion liquid of the conductive substance does not contain a binder resin from the standpoint of improving conductive performance. When no binder resin is used, contact between conductive substances is not blocked in the conductive layer. Accordingly, conductivity between conductive fine particles is reliably obtained, and the electrical resistance of the resulting conductive layer can be suppressed to be lower. In addition, a binder-resin-free dispersion liquid of a conductive substance is preferable from the standpoint that when a transparent conductive coating film is formed on a transparent substrate, the transparent conductive coating film can be easily detached from the substrate in the subsequent step. Furthermore, the subsequent fixing of a patterned transparent conductive layer on the substrate by a coating material for a protective layer is performed by impregnating the conductive layer with the coating material for a protective layer so that the coating material reaches the substrate. When a dispersion liquid of the transparent conductive substance contains no binder resin, the resulting transparent conductive layer includes a larger number of gaps. Thus, such a binder-resin-free dispersion liquid of the transparent conductive substance is preferable from the standpoint that the fixing by the impregnation of the coating material of a protective layer is not inhibited.

However, a resin may be contained in an amount that does not decrease the conductivity of a coating film on a substrate and a detachability of the coating film from the substrate, and that does not adversely affect the step of fixing the conductive layer by a resin contained in the coating material for a protective layer. The type and the amount of resin can be appropriately selected within ranges in which the above-described properties can be obtained.

By mixing such an appropriate small amount of resin, it is possible to achieve an effect of satisfactorily fixing the conductive layer coating film on the substrate, and preventing the coating film from detaching in the step of forming a pattern.

The dispersion liquid of the conductive substance may contain the above resin and other additives within the above range of the amount added in order to adjust the viscosity, to prevent corrosion, to improve adhesiveness to a substrate, and to control dispersion of the conductive substance. Examples of the appropriate additives and binding agent include, but are not limited to, carboxymethyl cellulose (CMC), 2-hydroxyethyl cellulose (HEC), hydroxypropyl methylcellulose (HPMC), methylcellulose (MC), polyvinyl alcohol (PVA), tripropylene glycol (TPG), xanthan gum (XG), surfactants such as ethoxylates, alkoxylates, ethylene oxide, and propylene oxide, and copolymers thereof, sulfonates, sulfates, disulfonates, sulfosuccinates, phosphoric esters, and fluorine-containing surfactants. In the case where the conductive substance is produced in an aqueous system, various water-soluble resins such as polyvinyl alcohol resins, vinylpyrrolidone polymers, and cellulose derivatives can be used.

Furthermore, non-polymer organic compounds such as 2-alkoxyethanols, β-diketones, and alkyl acetates can also be used as a film-forming agent.

Examples of the usable transparent substrate on which a transparent conductive layer is formed in the present invention mainly include films composed of a plastic such as a polyester, e.g., polyethylene terephthalate or polyethylene naphthalate, a polyolefin, e.g., polyethylene, polypropylene, polystyrene, or ethylene vinyl acetate (EVA), a vinyl resin, e.g., polyvinyl chloride or polyvinylidene chloride, polysulfone, polyethersulfone, polycarbonate, polyamide, polyimide, or an acrylic resin; glass plates, and ceramic plates. Among these, transparent substrates having a total visible light transmittance of 70% or more are preferable. These substrates may be colored to the extent that does not impair the object of the present invention. Furthermore, these substrates may be used as a single layer or as a multilayer film including a combination of two or more layers. Furthermore, a detachment-facilitating treatment may be performed on at least one surface of the substrate. Among these plastic films, a polyethylene terephthalate film and a polyethylene naphthalate film are preferable, and a polyethylene terephthalate film is the most suitable from the standpoint of transparency, heat resistance, handleability, and the cost. When the thickness of this transparent plastic substrate is small, handleability is poor. When the thickness of this plastic transparent substrate is large, the transmittance of visible light decreases. Accordingly, the thickness of the transparent substrate is preferably 5 to 300 μm, more preferably 10 to 250 μm, still more preferably 25 to 200 μm, and further still more preferably 50 to 88 μm.

In order to form a transparent conductive coating film on a transparent substrate using the above-described materials, as shown in FIG. 1, a dispersion liquid containing a transparent conductive substance, a dispersion medium, and an optional resin is applied onto a transparent substrate (1), and dried to form a uniform conductive coating film (2) on the transparent substrate.

A known coating method such as spray coating, bar coating, roll coating, die coating, ink jet coating, screen coating, or dip coating can be employed.

When the thickness of the transparent conductive layer is excessively small, a sufficient conductivity as a conductor tends not to be achieved. When the thickness of the transparent conductive layer is excessively large, transparency tends to be impaired due to an increase in the haze value, a decrease in the total light transmittance, and the like. The thickness of the transparent conductive layer is appropriately adjusted to be in the range of 10 nm and 10 μm. However, in the case where the conductive substance itself is not transparent, e.g., in the case of a metal nanowire, transparency is easily lost by an increase in the thickness of the conductive layer, and thus a conductive layer having a smaller thickness is often formed. In this case, the conductive layer has a large number of openings, and the thickness of the conductive layer is preferably in the range of 10 to 500 nm, more preferably in the range of 30 to 300 nm, and most preferably in the range of 50 to 150 nm in terms of an average thickness measured with a contact-type film thickness meter.

The transparent conductive layer contains a conductive substance or contains a conductive substance, a resin, and other additives described above. In the case where a resin is used, the amount of resin added is determined in consideration of, for example, the conductivity of the conductive coating film, detachability, and the ease of permeation of a coating material for a protective layer. However, the resin is preferably added in a minimum necessary amount so that the conductive substance in the transparent conductive layer is satisfactorily fixed to the substrate and is not easily detached in the subsequent steps. In such a case, after the formation of a transparent conductive layer on a substrate, the resin is easily concentrated on the substrate side of the transparent conductive layer and the conductive substance tends to be easily fixed to the substrate. However, on the side away from the substrate, the conductive substance is exposed without being covered with the resin, thus easily forming a state in which gaps are present between conductive substances.

As means for easily detaching the transparent conductive layer (2) provided on the transparent substrate (1) from the substrate, an underlayer that facilitates the detachment of the transparent conductive layer (2) may be provided on the coating surface of the transparent substrate in advance. In such a case, it is preferable to form an underlayer that does not impair the transparency of the substrate having the conductive layer (2) thereon, the conductivity, and adhesiveness of a binder resin in the coating material for a protective layer. The composition and the structure of the underlayer can be appropriately selected in accordance with the type of the transparent substrate (1) and the composition of the coating material for a protective layer, the coating material penetrating through the transparent conductive layer (2) from above and reaching the substrate in the subsequent step.

In the method for producing the transparent conductive layer of the present invention, after the detachable conductive coating film is formed on the transparent substrate, in order to further increase the conductivity of the transparent conductive layer, it is possible to perform a pressurizing step for increasing the number of contact points in intersecting portions of transparent conductive substances in the transparent conductive layer formed by coating and for increasing the contact area in the intersecting portions to reliably establish the contact.

The step of pressuring the intersecting portions of the conductive substances is specifically a step of pressurizing a surface of the transparent conductive layer. In the case where the transparent conductive substances are conductive fine particles, the pressuring step is a step of improving the density of the fine particles to increase the number of contact points between the fine particles and the contact area thereof. In the case where the transparent conductive substances have a fiber shape, more specifically a wire shape, e.g., in the case where the transparent conductive substances are metal nanowires, the pressuring step is a step of compressing the transparent conductive layer by applying a pressure from right above to the transparent conductive layer in which the metal nanowires are dispersed in the form of a network to increase the number of contact points of the metal nanowires disposed inside. This step decreases the contact resistance between the conductive fine particles or between the metal nanowires.

This step can be performed by a known, common method of pressurizing a surface of a coating film, and the method is not particularly limited. Examples of the method include a flat-plate pressing method in which a transparent conductive layer obtained by coating is arranged between two flat plates that can be pressurized, and a pressure is then applied to the flat plates for a certain period of time, and a calender method in which a transparent conductive layer obtained by coating is linearly pressurized by interposing between two rolls that can be pressurized, and is pressurized over the entire surface by rotating the rolls.

In the calender method using rolls, the pressure applied to the transparent conductive layer is 500 to 50,000 kN/m$^2$, preferably 1,000 to 10,000 kN/m$^2$, and more preferably 2,000 to 5,000 kN/m$^2$.

(B) [Preparation of Support Having Layer Having Patterned Adhesive Area, Preferably a Heat-Sensitive Adhesive Layer]

A detachment base is prepared in order to partially detach, from a substrate, a transparent conductive layer formed on the substrate. Any detachment base can be widely used as long as a layer having a negative-patterned adhesive area for partially detaching the transparent conductive layer is formed on a film support. Such a detachment base can be prepared by uniformly forming, on a film support, a functional coating film that has or that can exhibit an adhesive function, and then partially exhibiting or deactivating the adhesive function by light irradiation or the like so as to form a pattern. Alternatively, the detachment base may be prepared by directly printing a negative pattern on a film support using an adhesive.

In order to print an adhesive on a film support in the form of a negative pattern, it is necessary to prepare a printing plate corresponding to the negative pattern. Therefore, from the standpoint of easily switching to various patterns, it is preferable to employ the former method in which a functional coating film composed of a photo-curable composition or the like is uniformly formed, and an adhesive function of the coating film is partially exhibited or deactivated by a partial light irradiation or the like.

Such a detachment base can be prepared as follows. For example, a photo-curable composition having adhesiveness is applied onto a support film to form a uniform coating film. The coating film is irradiated with light while being covered with a mask having a negative pattern. As a result, a portion of the coating film, the portion being other than the negative pattern, is cured, and the adhesiveness of the portion is lost. Thus, an adhesive area having the negative pattern is formed.

For example, as the photo-curable composition having adhesiveness and capable of being used in the preparation of such a detachment base, it is possible to use a composition obtained by adding, for example, a photopolymerizable polyfunctional oligomer such as tetramethylolmethane tetraacrylate or pentaerythritol triacrylate to a polymerizable polymer in which a photopolymerizable unsaturated bond is introduced in a polymer such as an alkyl acrylate or an alkyl methacrylate so as to utilize cure shrinkage or a decrease in the modulus of elasticity caused by light irradiation.

In the case where a detachment step is actually performed using such a detachment base, a layer of the detachment base, the layer having an adhesive function, is irradiated with light in advance so that a specific pattern exhibits or loses adhesiveness, and a transparent conductive layer can then be partially detached using the detachment base. Alternatively, a light-unirradiated detachment base is bonded to a transparent conductive layer, and the bonded surface is then irradiated with light through a mask so as to partially exhibit or lose adhesiveness. The transparent conductive layer can then be partially detached using the detachment base.

In the case where a large number of detachment bases having a single pattern are prepared, from the standpoint of production efficiency, it is preferable to employ a method including direct printing on a support film, in which a process, such as light irradiation, for forming a partial adhesive area on a uniform coating film is not necessary. In particular, in the case where a heat-sensitive adhesive is used as an adhesive, although a common printed coating film that does not have adhesiveness is obtained at room temperature, the coating film temporarily exhibits an adhesive function in a heating step added during the detachment step, and rapidly loses the adhesive function after a decrease in the temperature. Thus, the handleability of the detachment base is good before and after the detachment step.

Figure 2:
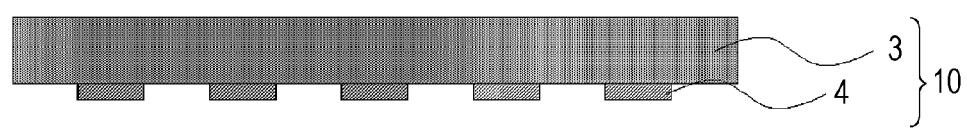
FIG. 2 is a cross-sectional view of a support having a negative-patterned heat-sensitive adhesive in the present invention.

In the case where the method including directly printing a negative-patterned heat-sensitive adhesive layer on a support film is employed in the preparation of the detachment base, as shown in FIG. 2, a detachment base (10) used in the present invention includes a film-like support (3) and a negative-patterned heat-sensitive adhesive layer (4) disposed on the film-like support (3). The detachment base (10) can be formed by applying, onto the film-like support (3), a coating material for a heat-sensitive adhesive layer, the coating material containing a heat-sensitive adhesive and a solvent, so as to form a negative pattern that is the inverse of a desired conductive pattern to be formed on a substrate.

Although the heat-sensitive adhesive does not exhibit adhesiveness at room temperature, it exhibits adhesiveness when being heated. The heat-sensitive adhesive of the heat-sensitive adhesive layer formed on the support is not particularly limited as long as the heat-sensitive adhesive has affinity with both the transparent conductive layer formed on the transparent substrate and the support, and can strongly bond the transparent conductive layer to the support. Various known heat-sensitive adhesives can be used. Regarding the temperature at which adhesiveness is exhibited, in the case where a film is used as the transparent substrate, preferably, the adhesiveness is exhibited at a temperature that does not significantly exceed the glass transition temperature of the substrate film. In addition, when the heat-sensitive adhesive is warmed to the temperature, preferably, the heat-sensitive adhesive penetrates through gaps between conductive substances in the transparent conductive layer, and satisfactorily adheres to the conductive substances. Furthermore, when the support is detached at about room temperature after heating, the heat-sensitive adhesive preferably exhibits a strong adhesive strength to the conductive fine particles and the support.

Examples of the heat-sensitive adhesive include polyurethane adhesives, polyester adhesives, vinyl chloride/vinyl acetate copolymer adhesives, and acrylic adhesives. Among these, a heat-sensitive adhesive which has a glass transition temperature Tg of room temperature or higher, which has an acid group such as a carboxylic acid group or a sulfonic acid group, and which contains, as a base resin, an amorphous polyester resin or a polyester polyurethane resin is preferable. The glass transition temperature is preferably in the range of 20° C. to 100° C. Furthermore, for the purpose of controlling the heat-sensitive temperature, an appropriate amount of another resin having compatibility with the above base resin and a glass transition temperature Tg different from that of the base resin may be mixed.

If necessary, polyolefin resin particles may be added as an anti-blocking agent to the heat-sensitive adhesive. Among polyolefin resin particles, polyethylene resin particles or polypropylene resin particles are preferably added. More specifically, it is preferable to add high-density polyethylene resin particles, low-density polyethylene resin particles, modified-polyethylene resin particles, degradable low-density polyethylene resin particles, or degradable polypropylene resin particles. The polyethylene resin particles, degradable polyethylene resin particles, polypropylene resin particles, and the degradable polypropylene resin particles have a weight-average particle diameter of 0.1 to 25 μm. When these particles have a flat shape or a scaly shape, the particles preferably have a length of the major axis in the range of 3 to 25 μm, a molecular weight in the range of 1,000 to 29,000, and a melting point in the range of 100° C. to 150° C.

The solvent used in the coating material for the heat-sensitive adhesive layer is not particularly limited and any non-corrosive solvent may be used as long as the solvent satisfactorily dissolve or disperse the binder resin used in the heat-sensitive adhesive. Examples of the more appropriate solvents include not only water, alcohols, and ketones, but also cyclic ether compounds such as tetrahydrofuran, hydrocarbons such as cyclohexane, and aromatic solvents such as benzene, toluene, and xylene. Furthermore, the solvents are volatile and have a boiling point of preferably 200° C. or lower, more preferably 150° C. or lower, and still more preferably 100° C. or lower.

Examples of the support used in the detachment base in the present invention mainly include films composed of a plastic such as a polyester, e.g., polyethylene terephthalate or polyethylene naphthalate, a polyolefin, e.g., polyethylene, polypropylene, polystyrene, or EVA, a vinyl resin, e.g., polyvinyl chloride or polyvinylidene chloride, polysulfone, polyethersulfone, polycarbonate, polyamide, polyimide, or an acrylic resin. Among these, preferable are films that are not thermally deformed in the step of bringing the transparent conductive layer into close contact with the heat-sensitive adhesive layer and bonding these layers to each other under heating.

These supports may be colored to the extent that does not impair the object of the present invention. Furthermore, these supports may be used as a single layer or as a multilayer film including a combination of two or more layers. Among these, a polyethylene terephthalate film is the most suitable from the standpoint of transparency, heat resistance, handleability, and the cost. When the thickness of this transparent plastic base is small, heat resistance is poor. When the thickness of this plastic transparent base is large, the heat capacity increases, and a long heating time is necessary to exhibit adhesiveness in the heating of the heat-sensitive adhesive. Accordingly, the thickness of the transparent plastic base is preferably 5 to 100 μm, more preferably 10 to 50 μm, and still more preferably 15 to 30 μm.

The heat-sensitive adhesive layer on the support is formed so as to have a negative pattern that is the inverse of a desired transparent conductive pattern to be obtained on the substrate.

A known printing method can be employed as a method for forming the negative pattern of the adhesive. The method is not particularly limited and any known method can be employed as long as the heat-sensitive adhesive can have a sufficient thickness so that the resulting heat-sensitive adhesive layer that exhibits adhesiveness due to heating is satisfactorily in close contact with the transparent conductive layer on the substrate in the subsequent step. For example, a gravure printing method, an offset printing method, a gravure offset printing method, a screen printing method, an ink jet printing method, or the like can be employed. The thickness of the heat-sensitive adhesive layer is preferably 0.05 to 5.0 μm, more preferably 0.1 to 2.0 μm, and still more preferably, 0.2 to 1.0 μm.

As described above, in the case where the detachment base, in which a negative-patterned heat-sensitive adhesive layer is formed on a film support in advance, is used, it is not necessary to perform treatments for patterning, such as a light irradiation treatment and a removal treatment of a portion to be detached by a wet process. The detachment base can be continuously formed by applying or printing a coating material for a heat-sensitive adhesive layer on a roll-shaped support. This detachment base can be used without further treatment in the detachment step which is the subsequent step.

(C) [Step of Patterning Transparent Conductive Layer]

A step of patterning a transparent conductive layer of the present invention includes (3) a step of bonding the substrate and the support so that the transparent conductive layer and the heat-sensitive adhesive layer are in close contact with each other, and (4) a step of forming a pattern by leaving a desired portion of the transparent conductive layer on the substrate by detaching the support from the substrate to transfer a portion of the transparent conductive layer, the portion being in close contact with the heat-sensitive adhesive layer, to the heat-sensitive adhesive layer. In the bonding step, the substrate having the transparent conductive layer thereon and the detachment base including a support having a negative-patterned heat-sensitive adhesive layer thereon are bonded to each other so that the transparent conductive layer and the heat-sensitive adhesive layer are in close contact with each other, heated, and pressurized. In particular, in the case where the transparent conductive layer does not contain a binder resin or contains only a small amount of binder resin, the heat-sensitive adhesive is softened by the heating and pressurization of the heat-sensitive adhesive layer, and permeates through gaps between conductive fine particles in the transparent conductive layer or through a network of a fibrous conductive substance. Thus, the heat-sensitive adhesive and the conductive substance in the transparent conductive layer are bonded to each other.

Subsequently, the heat-sensitive adhesive layer in the bonded portion is cooled to about room temperature, and the support is then detached from the substrate, whereby a portion of the transparent conductive layer, the portion being bonded to the heat-sensitive adhesive layer, is detached and transferred to the negative-patterned heat-sensitive adhesive layer on the support. Consequently, a positive pattern of the transparent conductive layer remains on the substrate, and thus a desired transparent conductive layer pattern is formed on the substrate.

Figure 3:
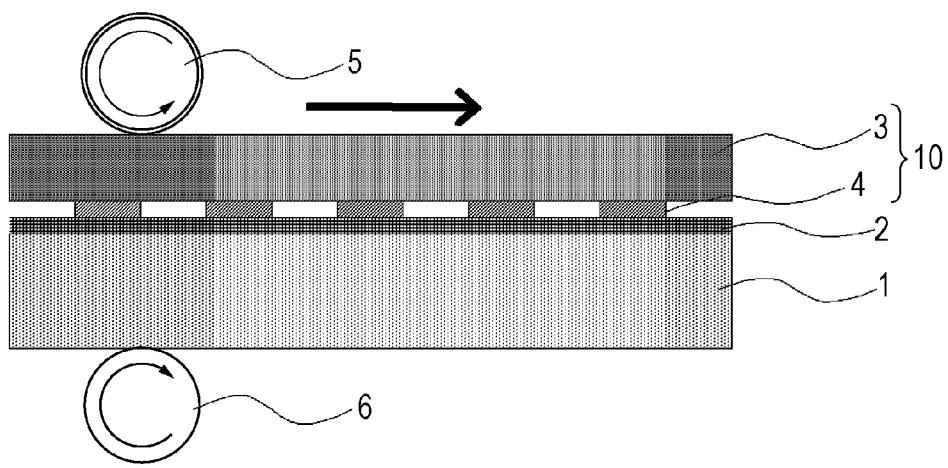
FIG. 3 is a schematic cross-sectional view showing a step of bonding the substrate having the transparent conductive layer to the support having the negative-patterned heat-sensitive adhesive under heating and pressure in the present invention.

As a bonding method used in the production method of the present invention, any method can be employed without particular limitations as long as thermal deformation of the substrate is not caused by the heating and pressurization during the bonding. Examples of the method include a flat plate lamination method in which the transparent conductive layer of the substrate and the heat-sensitive adhesive layer on the support of the detachment base are arranged between two flat plates that can be heated and pressurized, and heated and pressurized for a certain period of time; and a roll lamination method in which, as shown in FIG. 3, the substrate (1) having the transparent conductive layer (2) and the support (3) having the heat-sensitive adhesive layer (4) are conveyed and interposed between a nip of a pair of rolls (5) and (6), at least one of which can be heated, and heated and linearly pressurized, and the entire surfaces of the substrate (1) and the support (3) are pressurized by rotating the rolls (5) and (6).

In particular, in the latter roll lamination method, a roll-to-roll continuous process can be performed using the film substrate and a film-like detachment base, and thus excellent production efficiency can be achieved. As described above, at least one of the rolls used in the roll lamination method can be heated. The materials of the rolls are not particularly limited as long as the transparent conductive layer and the heat-sensitive adhesive layer are satisfactorily thermally bonded to each other, and thermal deformation of the substrate is not caused. As a combination of a rigid roll, which is mainly a metal roll, and an elastic roll, which is mainly a heat-resistant rubber, all the combinations of metal/metal, metal/elastic, and elastic/elastic can be used. However, in order to exhibit adhesiveness of the heat-sensitive adhesive in the nip of the pair of the rolls, the elastic/elastic roll pair or the elastic/metal roll pair, with which the nip width can be increased and the heating time can be extended, is preferable.

As for the processing conditions during bonding, conditions of the temperature and pressure at which the adhesiveness of the heat-sensitive adhesive to the transparent conductive layer is exhibited without causing thermal deformation of the film substrate are appropriately selected. For example, the processing temperature is preferably 70° C. to 150° C., more preferably 80° C. to 130° C., and still more preferably 90° C. to 120° C. As for the pressure, a minimum linear pressure at which a satisfactory transfer state can be obtained in the range of 10 to 60 kN/m is selected in terms of roll linear pressure.

Furthermore, the heat-sensitive adhesive layer portion may be preliminarily heated before bonding, as required. If air bubbles are mixed in the heat-sensitive adhesive layer, partial bonding failure between the heat-sensitive adhesive layer and the conductive layer occurs, and thus detachment of the conductive layer using the detachment base tends to be incomplete. Therefore, in order to prevent air bubbles from being mixed, in the bonding step, the heating and pressurization of the heat-sensitive adhesive layer portion of the detachment base may be conduced in a reduced pressure atmosphere.

Figure 4:
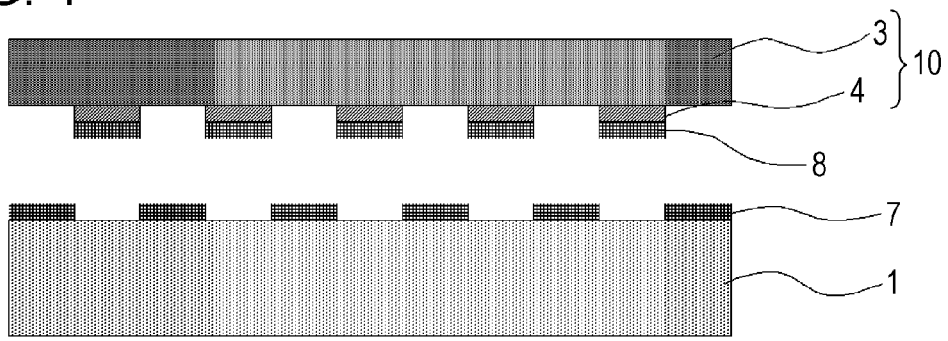
FIG. 4 is a schematic cross-sectional view showing a step of detaching the support having the negative-patterned heat-sensitive adhesive from the substrate having the transparent conductive layer in the present invention.

In the step of detaching the bonded substrate and detachment base, the substrate having the transparent conductive layer thereon and the detachment base including a support having a patterned heat-sensitive adhesive layer thereon are cooled to about room temperature, and the support is detached from the substrate. As shown in FIG. 4, a transparent conductive layer (8) bonded to the heat-sensitive adhesive layer in the detachment step, the transparent conductive layer (8) being located at a position corresponding to a portion where the heat-sensitive adhesive layer (4) on the support (3) is formed, is detached from the substrate together with the heat-sensitive adhesive layer (4). A transparent conductive layer (7) located at a position that does not correspond to the portion where the heat-sensitive adhesive is formed remains on the substrate (1) as a positive pattern of the transparent conductive layer. Thus, the pattern of the transparent conductive layer is formed on the substrate. Prior to the detachment of the detachment base, cooling such as the blowing of cooling air onto the support of the detachment base and the heat-sensitive adhesive layer portion may be performed. Such cooling is effective in order to satisfactorily perform the detachment and to prevent patterning defect such as the generation of an undetached portion.

In the method for forming a patterned transparent conductive layer of the present invention, a negative pattern is formed on a detachment base using a heat-sensitive adhesive, and an unnecessary portion of a transparent conductive layer that is uniformly formed on a substrate is detached from the transparent conductive layer. Patterning of the transparent conductive layer using the detachment base is determined only on the basis of the presence or absence of the heat-sensitive adhesive applied onto a support of the detachment base, and the heat-sensitive adhesive is not applied to a portion of the detachment base, the portion corresponding to a portion of the transparent conductive layer that is not to be detached. Accordingly, the transparent conductive layer can be reliably left on the substrate, and it is possible to prevent a decrease in the light transmittance of the transparent conductive layer caused by an unnecessary heat-sensitive adhesive remaining on the transparent conductive layer.

When this method for forming a desired conductive pattern, the method including detaching and removing, from a substrate, an unnecessary portion of a transparent conductive layer on the substrate using the detachment base (10) having the negative-patterned heat-sensitive adhesive layer (4), is employed, the transparent conductive layer, which is formed on the substrate in the step of forming the transparent conductive layer by coating, partially remains as it is. Therefore, unlike the case where a portion detached in a detachment step using a positive pattern is used, a heat-sensitive adhesive layer is not formed so as to be adjacent to the transparent conductive layer. In addition, in the case where a positive pattern is used, a pattern detached from a substrate is used, and thus a portion of the conductive layer, the portion having been in contact with the substrate, functions as the top layer after pattern formation. In the case where a resin is used in the formation of the conductive layer, the resin is concentrated on this portion. As a result, the surface resistivity becomes high, and it becomes difficult to impregnate the conductive layer with a coating material for a protective layer in a subsequent step because the resin blocks the coating material.

In contrast, in the case where a conductive layer is detached in a detachment step using a negative pattern, in the remaining transparent conductive layer, a small amount of resin is concentrated on the side close to the substrate to fix a conductive substance to the substrate, and, on the side located away from the substrate, the conductive substance is exposed from the resin, as in the state where the transparent conductive layer is originally formed. Accordingly, in the subsequent step, a coating material for a protective layer satisfactorily permeates through the conductive layer, thus satisfactorily fixing the conductive substance in the conductive layer to the substrate. Before the coating material for a protective layer is applied, basically, the conductive substance is exposed on the surface of the conductive layer, and thus the surface of the conductive layer has a low surface resistivity and is in a state where the conductivity is good. Accordingly, by allowing the coating material for a protective layer to permeate through the conductive layer from above, a surface resistivity suitable for an intended use can be obtained.

Furthermore, since a pattern is formed before the fixing of the transparent conductive layer by the application of the coating material for a protective layer, the heat-sensitive adhesive easily permeates through the conductive substance in the conductive layer from a portion of the transparent conductive layer, the portion being in contact with the heat-sensitive adhesive. Thus, the conductive layer can be satisfactorily detached from the substrate.

(D) [Application of Coating Material for Protective Layer (Fixing of Transparent Conductive Layer)]

After a desired pattern of the transparent conductive layer is formed on the substrate, a coating material for a protective layer is applied over the entire surface of the substrate and the transparent conductive layer formed on the substrate.

Figure 5:
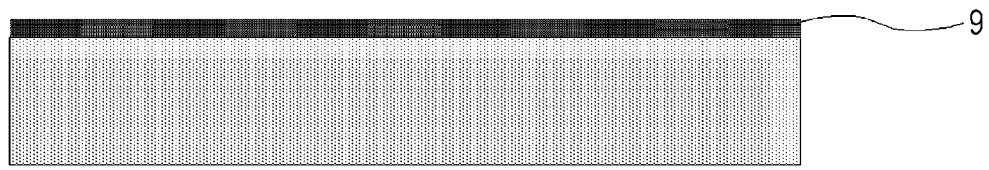
FIG. 5 is a cross-sectional view showing a state after a protective layer is formed by applying a coating material for the protective layer onto the patterned transparent conductive layer in the present invention.

A step of applying a coating material for a protective layer is performed as follows. As shown in FIG. 5, a coating material for a protective layer is applied over the entire surface of the substrate, a part of which is covered with a transparent conductive layer pattern formed in the bonding step and the detachment step described above. Subsequently, a solvent component is dried, and a contained resin component is cured to form a protective layer (9). Through this step, the surface of the transparent conductive layer is covered and protected, and the coating material for a protective layer reaches the substrate while filling gaps between conductive fine particles in the transparent conductive layer or gaps of a network formed by a fibrous, preferably, wire-shaped conductive substance. When the coating material is cured, the coating material strongly fixes the whole transparent conductive layer to the substrate, thus forming the substrate having the transparent conductive layer.

Materials and combinations of the materials that can be used as the binder resin used in fixing the transparent conductive layer will be described below. The fixing by the binder resin is performed by forming a solid polymer matrix. The solid polymer matrix is formed by polymerizing a monomeric substance or an oligomer (10 to 100 monomeric substances) contained in the coating material for a protective layer by light irradiation or heating or by cross-linking a resin contained in the coating material for a protective layer by drying and heating. Alternatively, the fixing by the binder resin is performed by forming a cross-linked coating film of a binder resin in a solvent by removing the solvent. The coating film is not limited to a coating film formed by being cured through polymerization or a cross-linking process. However, from the standpoint of durability and abrasion resistance of the coating film, the binder resin is preferably fixed through polymerization of a monomeric substance by visible light, ultraviolet light, an electron beam, heating, or the like, or cross-linking of a polymer compound with a cross-linking agent.

An organic polymer used as the binder resin for forming the solid polymer matrix preferably has a polar functional group bonded to a carbon skeleton. Examples of the polar functional group include a carboxyl group, an ester group, a ketone group, a nitrile group, an amino group, a phosphate group, a sulfonyl group, a sulfonic acid group, a polyalkylene glycol group, and an alcoholic hydroxyl group. Examples of the polymer useful as the binder include acrylic resins, alkyd resins, polyurethanes, acrylic urethanes, polycarbonate, polyesters, polystyrene, polyacetals, polyamides, polyvinyl alcohol, polyvinyl acetate, and cellulose. Examples of an inorganic polymer include siloxane polymers produced by hydrolysis and condensation of a tetraalkoxysilane.

In the case where a solid polymer matrix composed of an organic polymer is formed by polymerization, examples of the polymerizable organic monomer, which is a monomeric substance, or oligomer include acrylate and methacrylate monomers and oligomers such as methyl acrylate, methyl methacrylate, methoxypolyethyleneglycol methacrylate, glycidyl acrylate, ethylene oxide-modified phosphoric acid acrylate, urethane acrylate, polyethyleneglycol methacrylate, polybutadiene acrylate, and polyester acrylate; other vinyl monomers such as mono(2-methacryloyloxyethyl)acid phosphate, acrylic acid, methacrylic acid, itaconic acid, acrylonitrile, methacrylonitrile, styrene, and vinyltoluene; and epoxide compounds such as bisphenol-A glycidyl ether.

In the case where a solid polymer matrix composed of an inorganic polymer is formed by polymerization, examples of the polymerizable inorganic monomer, which is a monomeric substance, include mineral acid salts, organic acid salts, alkoxides, and complexes (chelates) of a metal such as Si, Ti, Zr, Al, Sn, Fe, Co, Ni, Cu, Zn, Pb, Ag, in, Sb, Pt, and Au. These monomers are polymerized through hydrolysis or thermal decomposition, and finally become an inorganic substance (such as a metal oxide, hydroxide, carbide, or a metal). Accordingly, these monomers are treated as inorganic monomers in the present invention. These inorganic monomers may also be used in the form of a partial hydrolysate thereof. Next, specific examples of a metallic compound will be exemplified, but the metallic compound is not limited thereto.

At least one of the above polymer binder (organic polymer or inorganic polymer) resins, or at least one of organic or inorganic monomers and organic or inorganic oligomers forming the polymer binders is dissolved in or diluted with an organic solvent, as required, to prepare a liquid having a viscosity of 25 cps or less, preferably 10 cps or less. This liquid is used for the impregnation of a coating film formed in a first step. When the viscosity of this liquid is higher than 25 cps, the liquid does not sufficiently permeate inside the coating film so as to reach the substrate at the time of the impregnation of the coating film. Consequently, a desired adhesiveness and effect of improving the film strength cannot be achieved. In addition, when the liquid has a high viscosity, an excessive amount of liquid is accumulated on the transparent conductive layer formed in the first step, thereby forming an insulating layer that does not contain conductive fine particles. Consequently, the conductivity significantly decreases.

The organic solvent used in the dissolution or dilution is not particularly limited. As long as the organic solvent can dissolve the above binder or the monomer that forms the binder, in addition to the various organic solvents exemplified as the dispersion medium related to the step of forming a coating film described in (1), liquid organic compounds used as the film-forming agent in the step of forming a coating film described in (1) and water may also be used as the solvent.

If necessary, the coating material for a protective layer, the coating material also being used as a liquid for impregnation, may contain a curing catalyst (in the case of heat curing), a photopolymerization initiator (in the case of ultraviolet curing), a cross-linking agent, a hydrolysis catalyst (e.g., an acid), a polymerization initiator, stabilizers (e.g., an antioxidant, an ultraviolet stabilizer for extending the life of products, and a polymerization inhibitor for improving the storage period), a surfactant, a pH-adjusting agent, and the like. The coating material may further contain a corrosion inhibitor for preventing corrosion of metal nanowires.

Examples of appropriate solvents include water, alcohols, ketones, cyclic ether compounds (such as tetrahydrofuran), hydrocarbons (such as cyclohexane), and aromatic solvents (such as benzene, toluene, and xylene). More preferably, the solvents are volatile and have a boiling point of 200° C. or lower, 150° C. or lower, or 100° C. or lower.

Any known wet coating method can be employed as the method for forming the protective layer without particular limitations. Specific examples thereof include spray coating, bar coating, roll coating, die coating, ink jet coating, screen coating, and dip coating.

In the case where the protective layer is formed while impregnating the transparent conductive layer with the coating material for the protective layer, when the thickness of the protective layer after the coating and drying is excessively smaller than that of the transparent conductive layer before the coating of the coating material for the protective layer, the functions of the protective layer, such as abrasion resistance, wear resistance, and weather resistance, decrease. When the thickness of the protective layer is excessively large, the contact resistance of the conductor increases.

When the transparent conductive layer having a thickness in the range of 50 to 150 nm is formed, the film thickness of the coating material for a protective layer after coating and drying is preferably 30 to 150 nm, and the application of the coating material can be controlled so as to realize desired values of the surface resistivity, the haze, etc. in consideration of the thickness of the transparent conductive layer. The film thickness of the coating material after coating and drying is more preferably 40 to 175 nm, and most preferably 50 to 150 nm. A preferable film thickness of the coating material for a protective layer after drying depends on the thickness of the transparent conductive layer. However, when the film thickness of the coating material is 30 nm or more, the transparent conductive substance is not excessively exposed on the surface of the protective layer, and the protective function of the protective layer tends to act more satisfactorily. When the film thickness of the coating material is 150 nm or less, an excessively thick coating film is not formed on the surface of the transparent conductive substance, and a more satisfactory conductive performance tends to be ensured.

When the coating material for a protective layer is applied over the entire surface of the substrate, the surface of which is partially covered with the patterned transparent conductive layer, the coating material for a protective layer covers the entire surface of the substrate while the transparent conductive layer portion is impregnated with the coating material for a protective layer. By performing the application of the coating material for a protective layer in the final step, the surface of the patterned transparent conductive film can be made smoother, and the coating material for a protective layer also enter the conductive layer by impregnation, as compared with the case where the conductive layer is fixed with the coating material for a protective layer and a conductive pattern is then formed. Thus, a more optically homogeneous, patterned transparent conductive film can be formed.

A touch panel can be fabricated by using a transparent conductive film for a touch panel, the transparent conductive film being prepared by the method for forming a patterned transparent conductive layer of the present invention.

EXAMPLES

Regarding a case where a transparent conductive substance is a nanowire, the present invention will now be described more specifically by way of Examples of a case where a transparent conductive layer film for a touch panel is produced. However, the present invention is not limited to these Examples.

(a) (Synthesis of Silver Nanowire)

Silver nanowires are synthesized by employing a method in which a polyol is used as a reducing agent, the method being described in Y. Sun, B. Gates, B. Mayers, & Y. Xia, "Crystalline silver nanowires by soft solution processing", Nano Letters (2002), 2(2), 165-168; then dissolving silver sulfate in ethylene glycol in the presence of polyvinylpyrrolidone functioning as a capping agent; and reducing the silver sulfate in the solution. Specifically, nanowires used in the present invention were synthesized by the amended polyol method described in U.S. Provisional Patent Application No. 60/815,627 applied by Cambrios Technologies Corporation.

(b) (Preparation of Transparent Conductive Layer)

An aqueous dispersion (ClearOhm™, Ink-AAQ, manufactured by Cambrios Technologies Corporation) containing, as metal nanowires forming a transparent conductive layer, 0.5% w/v of silver nanowires synthesized by the above method and having a minor axis diameter of about 70 to 80 nm and an aspect ratio of 100 or more in an aqueous medium was continuously applied onto a highly transparent polyethylene terephthalate (PET) film (Cosmoshine A4100, manufactured by Toyobo Co., Ltd.) having a thickness of 50 μm using a slot die coater so as to have a wet thickness of 20 μm, and dried. A pressurizing process is then continuously conducted by passing the PET film through calender rolls including a metal roll on the coating surface side and a resin roll on the back surface side at a pressure of 2,000 kN/m$^2$. Thus, a transparent conductive layer was formed (FIG. 1).

(c) (Preparation of Detachment Base Including Support Having Negative-Patterned Heat-Sensitive Adhesive Layer)

Figure 6:
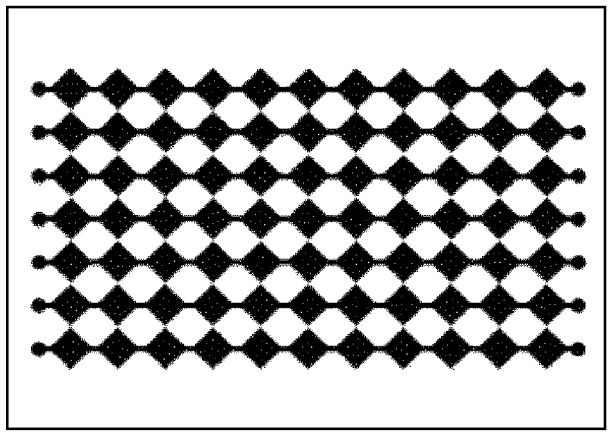
FIG. 6 is a plan view of a pattern for an X axis of a transparent conductive layer for a touch panel, the transparent conductive layer being formed by a method of the present invention.
Figure 7:
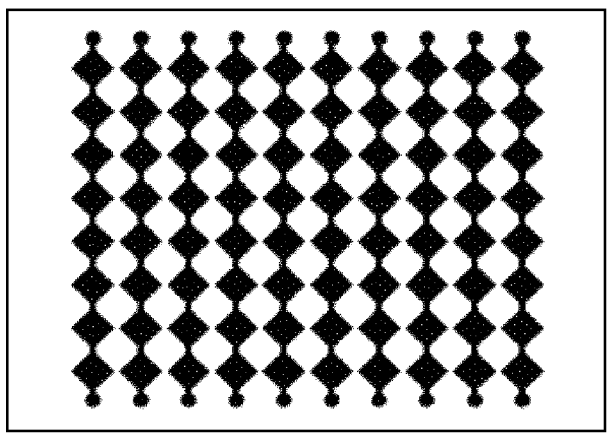
FIG. 7 is a plan view of a pattern for a Y axis of a transparent conductive layer for a touch panel, the transparent conductive layer being formed by a method of the present invention.
Figure 8:
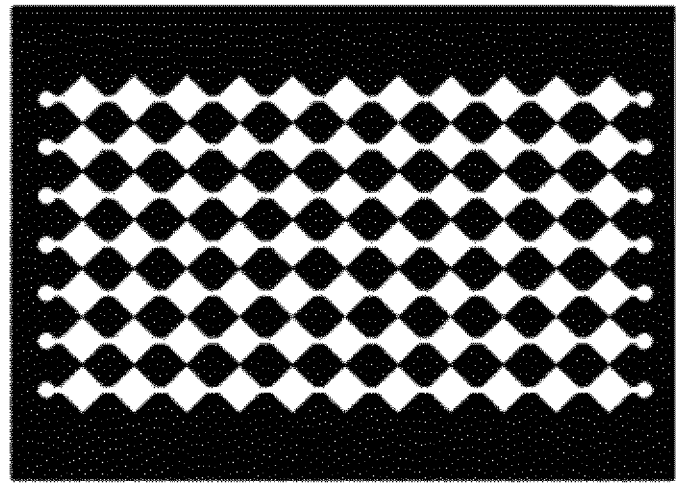
FIG. 8 is a plan view of a negative pattern for an X axis for a heat-sensitive adhesive layer formed on a support in the present invention.
Figure 9:
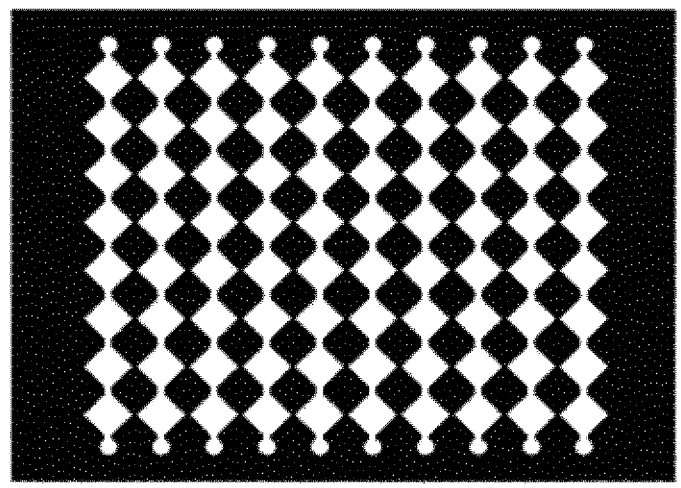
FIG. 9 is a plan view of a negative pattern for a Y axis for a heat-sensitive adhesive layer formed on a support in the present invention.

Next, 100 parts by weight of CRISVON NT-810-45 (a polyurethane resin manufactured by DIC Corporation, solution) was dissolved in 62.5 parts by weight of methyl ethyl ketone and 62.5 parts by weight of toluene to prepare a heat-sensitive adhesive. Regarding typical physical properties of this polyurethane resin, a glass transition temperature determined from a peak value of tan δ obtained by viscoelasticity measurement (temperature-increasing rate: 3° C./min) is 42° C., a tensile fracture strength and a tensile fracture elongation determined at a tensile speed of 300 ram/min are 277×10E5 Pa and 66.5%, respectively, and a flow-starting temperature determined by a measurement with a high-pressure flow tester (die: 1φ×1 L, pressurization: 98 N) is 90° C. The heat-sensitive adhesive solution was printed on a PET film (Teijin Tetron Film G2, manufactured by Teijin DuPont Films) having a thickness of 23 μm and functioning as a support so as to form a pattern. In this experiment, electrode patterns for a projective-capacitive touch panel, the electrode patterns shown in FIGS. 6 and 7, were used as desired conductive layer patterns to be formed on a substrate. Each of the patterns is a linear pattern in which a pattern of a diamond-shaped capacitive element having a length of a side of 4 mm and an inner angle of 90 degrees and a thin line pattern having a line width of 350 μm are alternately continued. Accordingly, patterns shown in FIGS. 8 and 9, which are negative patterns of the patterns to be formed by the transparent conductive layer and shown in FIGS. 6 and 7, respectively, were printed on the substrate by a gravure printing method. After a printed coating film was dried, coating was performed so that the thickness of the heat-sensitive adhesive layer was 0.5 to 0.8 thus obtaining a detachment base on which the heat-sensitive adhesive was printed so as to form a pattern of the negative images shown in FIGS. 8 and 9 (FIG. 2). In reality, printing is continuously conducted in such a manner that a plurality of patterns including, as units, the electrode patterns shown in FIGS. 6 and 7 are arranged in the material film.

(d) [Step of Patterning Transparent Conductive Layer]

Next, the substrate having the transparent conductive layer thereon, the substrate being prepared as a roll-shaped coated material, and the detachment base having the negative-patterned heat-sensitive adhesive layer were overlapped so that the transparent conductive layer and the heat-sensitive adhesive layer faced each other while traveling. Thus, the substrate and the detachment base were continuously bonded using a laminator including a heating and pressurizing nip formed by a metal heating roll and a heat-resistant silicone roll under the conditions of a heating roll temperature of 110° C., a roll nip pressure (linear pressure) of 30 kN/m, and a speed of 5 m/min (FIG. 3). At the time when the temperature at a bonded portion decreased to about room temperature, the support was continuously detached from the substrate while the bonded material was traveled, thus obtaining a roll-shaped film substrate having a patterned transparent conductive layer, i.e., a roll-shaped film substrate on which the transparent conductive layer was left in the form of a desired pattern (FIG. 4).

A patterned transparent conductive layer portion was observed with a microscope. The transparent conductive layer portion on the substrate was not damaged in the detachment step using the detachment base. In addition, the transparent conductive layer did not remain on a portion of the detachment base from which the transparent conductive layer was detached, and the heat-sensitive adhesive also did not adhere to the portion. In order to confirm that the detachment step was satisfactorily conducted, the light transmittance and the resistance of the transparent conductive layer in this state were measured. Table 1 shows the results.

[Formation of Protective Layer by Application of Coating Material for Protective Layer (Fixing of Transparent Conductive Layer)]

A coating material for a protective layer was prepared by sufficiently dissolving 100 parts of an acrylic resin (ACRYDIC A-815-45, manufactured by DIC Corporation, nonvolatile content: 45%) and 7.2 parts of an isocyanate curing agent (BURNOCK DN-980, manufactured by DIC Corporation, nonvolatile content: 75%) in 2,200 parts of methyl ethyl ketone and 2,200 parts of toluene.

This coating material for a protective layer was applied over the entire surface of the substrate having the patterned transparent conductive layer thereon using a slot die coater so as to have a wet thickness of 20 μm, more preferably 10 μm, while filling gaps between network nanowires in the transparent conductive layer with the coating material for a protective layer, and dried. Thus, a protective layer coating film having a dry thickness of about 0.1 μm was formed. Subsequently, the resulting substrate was left to stand in an atmosphere at 60° C. for 24 hours to perform a curing reaction between the isocyanate curing agent and the acrylic resin, thus forming a protective layer (FIG. 5). Thus, a transparent conductive film (film having a transparent conductive layer) having two types of transparent conductive layer patterns for a touch panel, the patterns being shown in FIGS. 6 and 7, was prepared. A capacitive touch panel is fabricated using the above film having the patterned transparent conductive layer through a step of overlapping and bonding two types of films each having a transparent conductive layer to each other in such a manner that the transparent conductive layers are arranged in the same direction (for example, upward direction) and transparent conductive layer-formed portions of one of the two films alternately overlap transparent conductive layer-detached portions of the other film, with a spacer therebetween. In order to evaluate as a transparent conductive film on which a conductive pattern of a transparent conductive film for a projective-capacitive touch panel is formed, the following measurements were performed for the transparent conductive layer pattern formed above. Table 1 shows the results.

In order to examine properties of a film having a patterned transparent conductive layer, the film being obtained after the detachment step, and a film having a patterned transparent conductive layer, the film being obtained after the application of the coating material for a protective layer, evaluation was conducted. The evaluation items and the measuring methods used in the evaluation will be described below.

[Surface Resistivity]

A sample of a substrate film before coating and samples of a transparent conductive layer portion after the formation of a transparent conductive layer were prepared so as to have a size of 10 cm square. The surface resistivity (Ω/square) of each of the samples was measured while pressing four probes on a central portion of the sample using a four-probe resistivity meter (Loresta-EP, manufactured by Mitsubishi Chemical Analytech Co., Ltd.). Regarding the substrate film before coating and the transparent conductive layer before pattern formation, five coating film samples having a size of 10 cm square were prepared from a central portion of each of a material film obtained before coating and a material film obtained after coating and before pattern formation. The surface resistivity of a central portion of each of the samples was measured. Regarding samples after pattern formation, the measurement was conducted for a portion on which the transparent conductive layer was formed and a portion from which the transparent conductive layer was detached. For this measurement, a pattern for measurement, the pattern having a larger area, was formed at the same time of the formation of the pattern for the touch panel. Five positions were selected from different portions of the pattern for measurement, and coating film samples each having a size of 10 cm square were prepared from the positions. The measurement of the samples was conducted, and the average of the measured values was determined.

[Measurement of Resistance of Transparent Conductive Layer Pattern for Touch Panel]

After the step of patterning the transparent conductive layer using the detachment base, and after the step of forming the protective layer, the electrical resistance of the transparent conductive pattern was measured by applying a tester to resistance measuring portions at both terminals of the respective transparent conductive patterns. Furthermore, the electrical resistance between adjacent transparent conductive patterns was also measured.

In the transparent conductive layer patterns for a touch panel used in the present invention, as shown in FIGS. 6 and 7, diamond patterns are connected to each other in an X-axis direction or in a Y-axis direction, and adjacent pattern sequences are insulated from each other. A pattern of a terminal for wiring is formed at each end of a pattern sequence. If the pattern sequence is disconnected at a halfway position, an appropriate resistance cannot be obtained in the measurement at both terminals. Furthermore, if adjacent pattern sequences are short-circuited at a halfway position, adjacent terminals of the pattern sequences are not satisfactorily insulated from each other. Accordingly, whether or not the patterning of the transparent conductive layer is satisfactorily performed can be examined by measuring the resistance between terminals at both ends of a pattern sequence and the resistance between adjacent terminals. Five different touch panel patterns were selected at a central portion of a material film. The measurement was performed at one pair of terminals at both ends and at one pair of adjacent terminals in each pattern. Thus, the measurement at terminals at both ends and the measurement at adjacent terminals were each performed at five positions, and the average of the measurement results was determined.

[Measurement of Optical Properties (Total Light Transmittance and Haze)]

After the transparent conductive layer was formed on the substrate (before patterning), optical properties of a transparent conductive layer portion were measured. Regarding a sample obtained after the patterning of the transparent conductive layer using the detachment base and a sample obtained after the formation of the protective layer on the pattern, the measurement was performed on both a transparent conductive layer portion after patterning and a portion from which the transparent conductive layer was detached by patterning. A total light transmittance (Tt) {in accordance with JIS K-7361, NDH-2000 measuring method 1} and a haze (the degree of haze) (Hz) {in accordance with JIS K-7136, NDH-2000 measuring method 3} were measured using an integrating sphere-type total light transmittance measuring device (NDH-2000 manufactured by Nippon Denshoku Industries Co., Ltd.). This measurement was also performed for a substrate film before the formation of the transparent conductive layer. Furthermore, a difference in the haze value was determined from a haze value of the substrate film before the formation of the transparent conductive layer and a haze value of a transparent conductive layer portion after the formation of the transparent conductive layer. Regarding the stage after the patterning using the detachment base and the stage after the formation of the protective layer on the pattern, the haze values were measured in a transparent conductive layer portion remaining on the substrate after the patterning using the detachment base, and in a portion from which the transparent conductive layer was detached using the detachment base, and a difference in the haze values was determined. Regarding the measurement samples of the substrate film and the transparent conductive layer before patterning, five samples each having a size of 10 cm square were prepared from a central portion of the material film. The measurement was conducted at a central portion of each of the samples, and the average of the measurement results was determined. Regarding the measurement after patterning of the transparent conductive layer and the measurement after the formation of the protective layer, a pattern for measurement, the pattern having a larger area, was formed at the same time of the formation of the pattern for the touch panel. Five samples of a portion on which the conductive layer was formed, and five samples of a portion from which the conductive layer was detached were prepared from different portions of the pattern for measurement. The measurement was conducted at a central portion of each of the samples, and the average of the measurement results was determined.

[Tape Test]

A protective layer was formed on a surface patterned using the detachment base and having a portion on which the transparent conductive layer was formed and a portion from which the transparent conductive layer was detached. Furthermore, an adhesive surface of a 3M Scotch 600 tape was firmly applied from above to a protective layer transparent conductive layer portion, and the tape was then peeled off. The surface resistivity, the linear resistance, and the optical properties were measured. In order to measure the resistance of the touch panel pattern, the peeling was conducted five times on different patterns located close to a central portion of the material film. The resistance was measured at one position corresponding to each peeled portion, and the measurement values of the resistance were averaged. Regarding the surface resistivity and the optical properties, a pattern for measurement, the pattern having a larger area, was formed at the same time of the formation of the touch panel pattern, and the peeling was performed at different positions of the pattern for measurement. The measurement was conducted at one position in each peeled portion, and thus the measurement was conducted at total five positions. The averages of the measurement values were determined.

TABLE 1

| Type of measurement sample | Measuring portion | Optical properties | | | Surface resistance of coating film | Measurement of resistance of touch panel pattern | | | |
|---|---|---|---|---|---|---|---|---|---|
| | | | | | | X-axis pattern | | Y-axis pattern | |
| | | Total light transmittance (%) | Haze (%) | Difference in haze (%) | Surface resistivity ($\Omega$/square) | Between both ends of pattern (k$\Omega$) | Between adjacent patterns (k$\Omega$) | Between both ends of pattern (k$\Omega$) | Between adjacent patterns (k$\Omega$) |
| Substrate before coating | | 90.2 | 0.43 | 0.93 | $10^8$ or more | — | — | — | — |
| Transparent conductive layer (before pattern formation) | | 89.6 | 1.36 | | 250 | — | — | — | — |
| Conductive pattern (after detachment step) | Transparent conductive layer portion | 89.7 | 1.42 | 0.96 | 250 | 9.7 | $10^5$ or more | 4.3 | $10^5$ or more |
| | Transparent conductive layer-detached portion | 90.3 | 0.46 | | $10^8$ or more | — | — | — | — |
| Conductive pattern (after formation of protective layer) | Transparent conductive layer portion | 89.1 | 1.31 | 0.87 | 250 | 9.7 | $10^5$ or more | 4.3 | $10^5$ or more |
| | Transparent conductive layer-detached portion | 90.1 | 0.44 | | $10^8$ or more | — | — | — | — |
| Conductive pattern (after tape test was performed on protective layer) | Transparent conductive layer portion | 89.8 | 1.42 | 0.97 | 250 | 9.7 | $10^5$ or more | 4.3 | $10^5$ or more |
| | Transparent conductive layer-detached portion | 90.0 | 0.45 | | $10^8$ or more | — | — | — | — |

As is apparent from Table 1, regarding the patterned transparent conductive layer after the detachment step, the portion on which the transparent conductive layer was formed hardly changed as compared with the transparent conductive layer before the detachment step, and exhibited a satisfactory total light transmittance and a low haze. The portion from which the transparent conductive layer was detached and on which the substrate was exposed exhibited substantially the same properties as those of the substrate before the transparent conductive layer was formed. Accordingly, the difference in haze between the portion on which the transparent conductive layer was formed and the portion from which the transparent conductive layer was detached was also substantially the same as the difference in haze between the original transparent conductive layer and the original substrate. These results show that the detachment step was satisfactorily performed, detachment defect and the transfer of the heat-sensitive adhesive layer did not occur, and the optical properties were not significantly affected.

Regarding the pattern film having the conductive layer, the pattern film being obtained after the formation of the protective layer, the optical properties of the portion on which the transparent conductive layer was formed and the portion from which the transparent conductive layer was detached were also substantially the same as those before the formation of the protective layer. These results show that the step of forming the protective layer was satisfactorily performed without affecting the optical properties.

Furthermore, the optical properties after the tape test also hardly changed as compared with those before the test. Thus, it was confirmed that the surface after the formation of the protective layer was not damaged by the tape test, and that a highly durable transparent conductive layer was formed.

In addition, the measurement of the resistance of the transparent conductive layer pattern for a touch panel showed that disconnection of portions to be electrically connected to each other and short-circuit of portions to be insulated from each other did not occur over the entire pattern, and thus satisfactory patterning was performed, and that the pattern was not damaged in the step of forming the protective layer and had satisfactory durability against the tape test.

INDUSTRIAL APPLICABILITY

The substrate having a patterned transparent conductive layer, and the transparent conductive layer pattern produced by the present invention can be used in an organic/inorganic electroluminescence electrode, electromagnetic wave shielding, an electrode for electronic paper, an electrode for a dye-sensitization solar cell, a liquid crystal electrode, and the like, and in particular, suitably used in a transparent electrode for a touch panel.

REFERENCE SIGNS LIST 1 substrate (for forming transparent conductive layer)
2 transparent conductive layer
3 support (for forming heat-sensitive adhesive negative pattern)
4 heat-sensitive adhesive layer
5 metal roller for heating and pressurization
6 heat-resistant silicone rubber roller for heating and pressurization
7 patterned transparent conductive layer
8 transparent conductive layer detached by heat-sensitive adhesive
9 protective layer (protective layer formed by impregnating transparent conductive layer with coating material for protective layer and fixed on substrate)
10 detachment base

The invention claimed is:

1. A method for manufacturing a patterned transparent conductive layer on a substrate, the method comprising the steps of:
   (1) forming by coating a detachable transparent conductive layer on a substrate; and
   (2) forming a layer having a negative-patterned adhesive area on a support; then
   (3) bonding the substrate to the support,
      wherein the transparent conductive layer is in direct contact with the adhesive area portion of the layer having the negative-patterned adhesive area;
   (4) detaching the support from the substrate,
      wherein a portion of the transparent conductive layer that is in direct contact with the adhesive area portion of the layer having the negative-patterned adhesive area is removed from the substrate,
      thereby forming a pattern of the transparent conductive layer that remains on the substrate; and
   (5) applying a coating material over the entire surface of the patterned transparent conductive layer on the substrate to form a protective layer.

2. The method for manufacturing a patterned transparent conductive layer according to claim 1, wherein the transparent conductive layer contains a particulate or fibrous conductive substance and can be impregnated with the coating material and the application of the coating material is performed while the transparent conductive layer on the substrate is impregnated with the coating material.

3. The method for manufacturing a patterned transparent conductive layer according to claim 1 or 2, wherein the transparent conductive layer contains metal nanowires, and the metal nanowires form a network structure.

4. The method for manufacturing a patterned transparent conductive layer according to claim 3, wherein the transparent conductive layer including the network structure composed of the metal nanowires is formed by applying a coating material for forming a conductive coating film, the coating material containing an aqueous medium and metal nanowires dispersed in the aqueous medium, and then drying the coating material.

5. The method for manufacturing a patterned transparent conductive layer according to claim 1 or 2, further comprising a step of pressurizing the transparent conductive layer after forming the detachable transparent conductive layer on the substrate by coating and before bonding the transparent conductive layer to the layer of the support, the layer having the adhesive area.

6. The method for manufacturing a patterned transparent conductive layer according to claim 1 or 2, wherein the layer having the negative-patterned adhesive area is a negative-patterned heat-sensitive adhesive layer.

7. A method for producing a transparent conductive film for a touch panel, the method comprising forming a pattern of a transparent conductive layer for a touch panel on a film-like substrate by the method for manufacturing a patterned transparent conductive layer according to claim 1 or 2.

* * * * *